United States Patent
Getz, Jr. et al.

(10) Patent No.: US 6,771,502 B2
(45) Date of Patent: Aug. 3, 2004

(54) HEAT SINK MADE FROM LONGER AND SHORTER GRAPHITE SHEETS

(75) Inventors: George Getz, Jr., Parma Heights, OH (US); Thomas W. Burkett, Avon Lake, OH (US)

(73) Assignee: Advanced Energy Technology Inc., Wilmington, DE (US)

( * ) Notice: Subject to any disclaimer, the term of this patent is extended or adjusted under 35 U.S.C. 154(b) by 0 days.

(21) Appl. No.: 10/184,837

(22) Filed: Jun. 28, 2002

(65) Prior Publication Data

US 2004/0001317 A1 Jan. 1, 2004

(51) Int. Cl.[7] .................................................. H05K 7/20
(52) U.S. Cl. ........................ 361/703; 361/704; 361/709; 361/710; 257/706; 165/80.3
(58) Field of Search ................................. 361/704, 705, 361/707, 709, 710; 257/706, 707, 718, 720, 722; 165/80.3, 135; 174/16.1, 16.3

(56) References Cited

U.S. PATENT DOCUMENTS

| | | | | |
|---|---|---|---|---|
| 5,390,734 A | * | 2/1995 | Voorhes et al. ............. 165/185 |
| 5,642,779 A | * | 7/1997 | Yamamoto et al. ......... 165/185 |
| 5,969,949 A | * | 10/1999 | Kim et al. .................. 361/704 |
| 6,046,498 A | * | 4/2000 | Yoshikawa ................. 257/706 |
| 6,076,594 A | * | 6/2000 | Kuo .......................... 165/80.3 |
| 6,208,513 B1 | * | 3/2001 | Fitch et al. ................. 361/704 |
| 6,424,529 B2 | * | 7/2002 | Eesley et al. ............... 361/703 |
| 6,482,520 B1 | * | 11/2002 | Tzeng ........................ 428/408 |
| 6,503,626 B1 | * | 1/2003 | Norley et al. ............... 428/408 |
| 6,538,892 B2 | * | 3/2003 | Smalc ........................ 361/710 |

* cited by examiner

*Primary Examiner*—Boris Chervinsky
(74) *Attorney, Agent, or Firm*—Waddey & Patterson; James R. Cartiglia

(57) ABSTRACT

A heat sink apparatus is constructed from alternating longer and shorter sheets of graphite material sandwiched together such that the longer sheets extend beyond the shorter sheets to define fins. The directions of higher thermal conductivity of the anisotropic graphite material are oriented in the plane of the sheet. The longer and shorter sheets have base ends aligned together to define a generally planar base surface for engaging an electronic device to be cooled.

21 Claims, 2 Drawing Sheets

FIG. 2

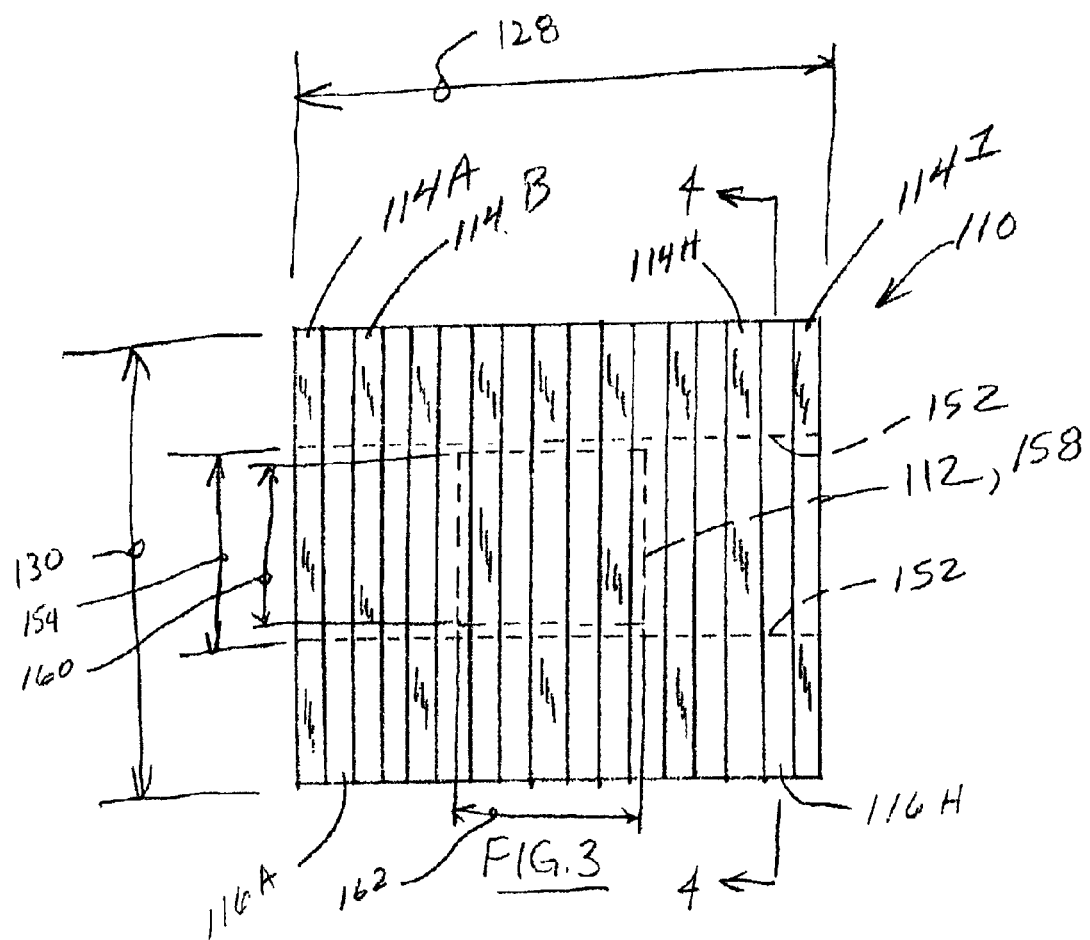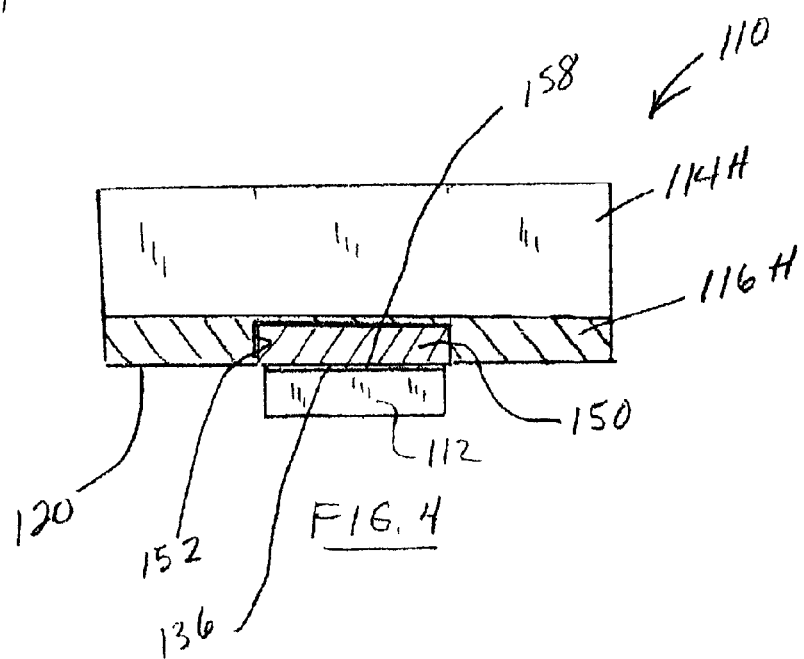

HEAT SINK MADE FROM LONGER AND SHORTER GRAPHITE SHEETS

TECHNICAL FIELD

The present invention relates to a heat sink capable of managing the heat from a heat source such as an electronic device.

BACKGROUND OF THE INVENTION

With the development of more and more sophisticated electronic devices, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates the negative effects of excessive heat.

With the increased need for heat dissipation from microelectronic devices, thermal management becomes an increasingly important element of the design of electronic products. Both performance reliability and life expectancy of electronic equipment are inversely related to the component temperature of the equipment. For instance, a reduction in the operating temperature of a device such as a typical silicon semiconductor can correspond to an increase in the processing speed, reliability and life expectancy of the device. Therefore, to maximize the life-span and reliability of a component, controlling the device operating temperature within the limits set by the designers is of paramount importance.

Several types of heat dissipating components are utilized to facilitate heat dissipation from electronic devices. The present invention is directly applicable to finned heat sinks.

These heat sinks facilitate heat dissipation from the surface of a heat source, such as a heat-generating electronic device, to a cooler environment, usually air. The heat sink seeks to increase the heat transfer efficiency between the electronic device and the ambient air primarily by increasing the surface area that is in direct contact with the air or other heat transfer media. This allows more heat to be dissipated and thus lowers the electronic device operating temperature. The primary purpose of a heat dissipating component is to help maintain the device temperature below the maximum allowable temperature specified by its designer/manufacturer.

Typically, the heat sinks are formed of a metal, especially copper or aluminum, due to the ability of metals like copper to readily absorb heat and transfer it about its entire structure. Copper heat sinks are often formed with fins or other structures to increase the surface area of the heat sink, with air being forced across or through the fins (such as by a fan) to effect heat dissipation from the electronic component, through the copper heat sink and then to the air.

The use of copper or aluminum heat dissipating elements can present a problem because of the weight of the metal, particularly when the heat transmitting area of the heat dissipating component is significantly larger than that of the electronic device. For instance, pure copper weighs 8.96 grams per cubic centimeter ($g/cm^3$) and pure aluminum weighs 2.70 $g/cm^3$.

For example, in many applications, several heat sinks need to be arrayed on, e.g., a circuit board to dissipate heat from a variety of components on the board. If metallic heat sinks are employed, the sheer weight of the metal on the board can increase the chances of the board cracking or of other equally undesirable effects, and increases the weight of the component itself. For portable electronic devices, any method to reduce weight while maintaining heat dissipation characteristics is especially desirable.

Another group of materials suitable for use in heat sinks are those materials generally known as graphites, but in particular graphites such as those based on natural graphites and flexible graphite as described below. These materials have a high thermal conductivity in the plane of the sheet of material of 370 W/m° K. This is higher than either aluminum (200 W/m° K) or copper (360 W/m° K). Also, the graphite materials are much lighter in weight and thus provide many advantages over copper or aluminum.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cm$^3$ to about 2.0 g/cm$^3$. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

There is a continuing need for improved heat sink designs which provide relatively low thermal resistance and relatively low weight as compared to prior designs.

SUMMARY OF THE INVENTION

The present invention provides a finned heat sink constructed from anisotropic graphite material, wherein the heat sink is made from alternating longer and shorter sheets of graphite material, which sheets are sandwiched together such that the longer sheets extend beyond the shorter sheets to define the fins of the heat sink apparatus.

Preferably, the longer and shorter sheets have their base ends aligned together to define a generally planar base surface for engaging an electronic device to be cooled by the heat sink apparatus.

In a preferred embodiment of the invention, the longer and shorter sheets are each constructed from laminated resin-impregnated graphite sheet material, and the resin of the resin-impregnated material provides sufficient adhesive characteristics to bond the alternating longer and shorter sheets together to form the heat sink apparatus.

Also, a copper bar may be inserted in the base, transverse to the plane of the sheets, to spread heat from the heat source to all of the fins.

A thermal management apparatus includes a heat sink like that just described in conjunction with an electronic heat source having a heat transfer surface defined thereon and in heat transfer engagement with the planar base surface of the heat sink apparatus.

In another aspect of the invention a method of manufacturing such a heat sink apparatus is provided, which method includes the steps of:

(a) forming a plurality of shorter and longer pieces of graphite material;

(b) assembling the shorter and longer pieces so that base ends of the pieces are aligned together to define a generally planar base surface, and so that the longer pieces extend beyond the shorter pieces to define fins extending in a direction away from the base surface; and (c) applying pressure to the pieces in a direction across a thickness of the pieces to bond the pieces together.

Accordingly, it is an object of the present invention to provide an improved heat sink design for thermal management of electronic devices.

And another object of the present invention is the provision of a finned heat sink apparatus constructed from alternating longer and shorter sheets of graphite material which are sandwiched together so that the longer sheets extend beyond the shorter sheets to define fins of the heat sink apparatus.

And another object of the present invention is the provision of a heat sink apparatus formed of graphite sheets all having their directions of higher thermal conductivity directed substantially perpendicularly away from a base surface of the heat sink apparatus so as to rapidly direct heat energy away from the device being cooled.

Other and further objects, features, and advantages of the present invention will be readily apparent to those skilled in the art, upon a reading of the following disclosure when taken in conjunction with the accompanying drawings.

BRIEF DESCRIPTION OF THE DRAWINGS

FIG. 3 is a schematic plan view of an alternative embodiment including a heat spreader in the base.

FIG. 4 is an elevation section view taken along line 4—4 of FIG. 3.

DETAILED DESCRIPTION OF THE PREFERRED EMBODIMENTS

Figure 1:
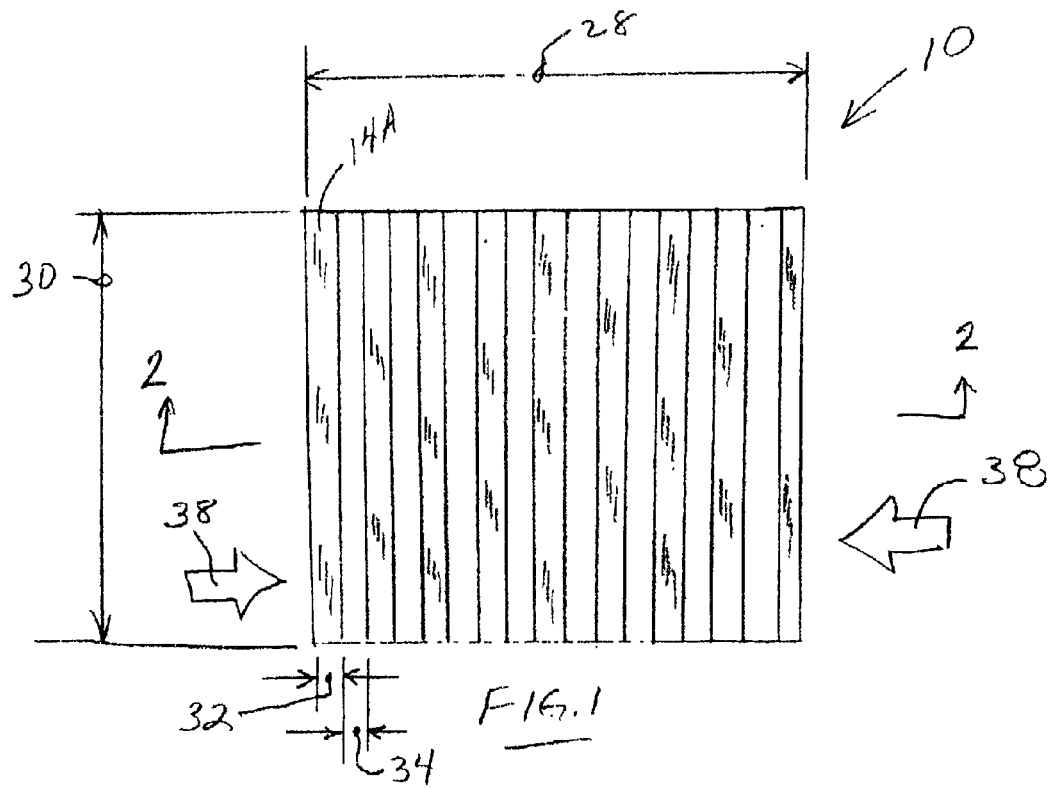
FIG. 1 is a schematic plan view of a heat sink constructed in accordance with the present invention.

As noted, the heat sinks of the present invention are constructed from graphite sheet material. Before describing the construction of the heat sinks, a brief description of graphite and its formation into flexible sheets is in order.

Preparation of Flexible Graphite Sheet

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes.

Flexible graphite sheet and foil are coherent, with good handling strength, and are suitably compressed, e.g. by roll pressing, to a thickness of about 0.075 mm to 3.75 mm and a typical density of about 0.1 to 1.5 grams per cubic centimeter ($g/cm^3$). From about 1.5–30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. Suitable resin content is preferably less than about 60% by weight, more preferably less than about 35% by weight, and most preferably from about 4% to about 15% by weight. Resins found especially useful in the practice of the present invention include acrylic-, epoxy- and phenolic-based resin systems, or mixtures thereof. Suitable epoxy resin systems include those based on diglycidyl ether or bisphenol A (DGEBA) and other multifunctional resin systems; phenolic resins that can be employed include resole and novolak phenolics.

Preparation of Laminated Graphite Materials

The longer and shorter graphite sheets used to construct the heat sinks described below are preferably constructed from a laminated resin impregnated graphite material in the manner set forth in U.S. patent application Ser. No. 09/943,131, filed Aug. 31, 2001 of Norley et al. entitled "LAMINATES PREPARED FROM IMPREGNATED FLEXIBLE GRAPHITE SHEETS", assigned to the assignee of the present invention, the details of which are incorporated herein by reference.

According to the Norley et al. process, flexible graphite sheets prepared as described above and having a thickness of about 4 mm to 7 mm are impregnated with a thermosetting resin such as an epoxy, acrylic or phenolic resin system. Suitable epoxy resins include diglycidyl ether of bisphenol A (DGEBA) resin systems; other multifunctional epoxy resins systems are also suitable for use in the present invention. Suitable phenolic resin systems include those containing resole and novolak resins. The sheets are then calendered to a thickness of about 0.35 mm to 0.5 mm, at which time the calendered, epoxy impregnated flexible mats have a density of about 1.4 $g/cm^3$ to about 1.9 $g/cm^3$.

The amount of resin within the epoxy impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 3% by weight, more preferably from about 5% to about 35% by weight depending on the characteristics desired in the final product.

In a typical resin impregnation step, the flexible graphite sheet is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite sheet. The resin is thereafter preferably dried, reducing the tack of the resin and the resin-impregnated sheet.

One type of apparatus for continuously forming resin-impregnated and calendered flexible graphite sheet is shown in International Publication No. WO 00/64808, the disclosure of which is incorporated herein by reference.

Following the calendering step, the impregnated sheets are cut to suitable-sized pieces which are stacked together and placed in a press, where they are cured at an elevated temperature. The temperature should be sufficient to ensure that the lamellar structure is densified at the curing pressure, improving the anisotropy of the structure and hence its thermal properties as a heat dissipating device. Generally, this will require a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be from 1000 to 3000 pounds per square inch (psi). The curing time may vary depending on the resin system and the temperature and pressure employed, but generally will range from 0.5 hours to 2 hours. After curing is complete, the composites are seen to have a density of from about 1.8 $g/cm^3$ to 2.0 $g/cm^3$.

Advantageously, the resin present in the impregnated sheets can act as the adhesive for the composite material. Alternatively the calendered, impregnated, flexible graphite sheets are coated with an adhesive before the flexible sheets are stacked and cured. Suitable adhesives include epoxy-, acrylic- and phenolic-based resins. Phenolic resins found especially useful in the practice of the present invention include phenolic-based resin systems including resole and novolak phenolics.

Optionally, non-graphite layers may be included in the pre-pressed stack. Such non-graphite layers may include metals, plastics or other non-metallics such as fiberglass or ceramics. The epoxy polymer in the impregnated graphite sheets is sufficient to, upon curing, adhesively bond the non-graphite as well as the impregnated graphite layers of the structure into place.

The following example is presented to further illustrate and explain the construction of suitable laminated structures and is not intended to be limiting in any regard. Unless otherwise indicated, all parts and percentages are by weight.

EXAMPLE 1

Graphite sheets with a weight per unit area of 70 mg/cm$^2$ with dimensions of approximately 30 cm by 30 cm were impregnated with epoxy such that the resulting calendered mats were 12 weight % epoxy. The epoxy employed was a diglycidyl ether of bisphenol A (DGEBA) elevated temperature cure formulation and the impregnation procedures involved saturation with an acetone-resin solution followed by drying at approximately 80° C. Following impregnation, the sheets were then calendered from a thickness of approximately 7 mm to a thickness of approximately 0.4 mm and a density of 1.63 g/cm$^3$. The calendered, impregnated sheets were then cut into disks with a diameter of approximately 50 mm and the disks were stacked 46 layers high. This stack of disks was then placed in a TMP (Technical Machine Products) press, and cured at 2600 psi at 150° C. for 1 hour. The resultant laminate had a density of 1.90 g/cm$^3$, a flexural strength of 8000 psi, a Young's modules of 7.5 Msi (millions of pounds per square inch) and an in plane resistivity of 6 microhm. The in-plane and through-thickness thermal conductivity values were 396 W/m ° K and 6.9 W/m ° K, respectively. The laminates exhibited superior machinability, had a continuous pore free surface with a smooth finish and were suitable for use in electronic thermal management devices. The highly anisotropic thermal conductivity resulted in a structure highly adapted for use in piping heat away from sensitive electronics and into a heat sink. In addition, the density of the material, approximately 1.94 g/cm$^3$, is considerably below aluminum (2.7 g/cm$^3$) and much less than copper (8.96 g/cm$^3$). Thus, the specific thermal conductivity (that is, the ratio of thermal conductivity to density) of the graphite laminate is about three times that of aluminum and about four to six times that of copper.

The laminated graphite materials suitable for use with the present invention are not limited to those specific ones described above, and may for example include a laminate comprised of layers of pyrolytic graphite sheet such as that manufactured by Matsushita Electric Components Co., Ltd. Ceramic Division, 1006 Kadoma, Osaka, Japan under the trade name Panasonic "PGS"® Graphite Sheet.

Figure 2:
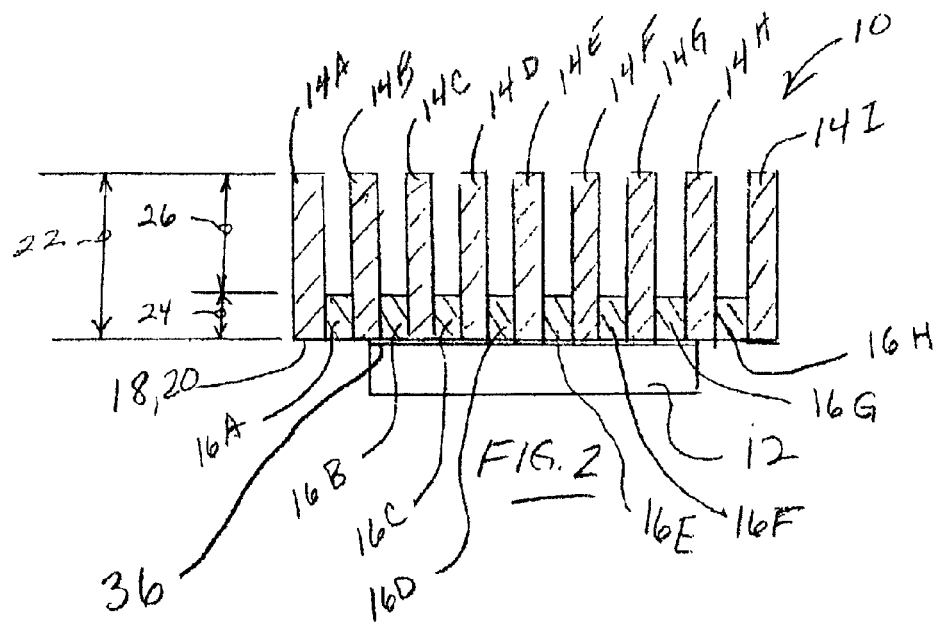
FIG. 2 is an elevation section view taken along line 2—2 of FIG. 1.

The Detailed Embodiment of FIGS. 1–2

Referring now to the drawings, and particularly to FIGS. 1 and 2, a heat sink apparatus is shown and generally designated by the numeral 10. In the elevation view of FIG. 2, the heat sink apparatus 10 is shown assembled with an electronic device 12 which is to be cooled, and the combination of the heat sink apparatus 10 and the electronic device 12 may be referred to as a thermal management apparatus.

The heat sink apparatus 10 is constructed from alternating longer sheets 14A–I, and shorter sheets 16A–H, which are sandwiched together such that the longer sheets 14 extend beyond the shorter sheets 16 to define fins.

The sheets 14 and 16 all have their base ends such as 18 aligned together to define a generally planar base surface 20.

The terms longer and shorter as used herein are used to refer to the height of the sheets above the base plane 20. For example, as seen in FIG. 2, the longer fins 14 have a longer length 22 as contrasted to the shorter fins 16 which have a shorter length 24.

Thus the longer sheets 14 extend beyond the shorter sheets 16 by a fin height 26.

The base surface 20 may be described as having a base length 28 and a base width 30 as seen in FIG. 1.

Each of the sheets such as sheet 14A may be described as a planar sheet having a plane defined by its height or length 22 and the base width 30. Each sheet such as sheet 14A may also be described as having a sheet thickness 32 which extends through the plane of the sheet. Similarly, shorter sheet 16A may be described as having a sheet thickness 34 and as having a plane defined by height or length 24 and base width 30.

The electronic device 12 is in thermal heat transfer engagement with the base surface 20. Preferably an interface layer 36 is provided which may be an adhesive, a thermal grease, or a solid thermal interface which may include a thin sheet of flexible graphite material.

The longer and shorter sheets 14 and 16, which alternatively may be referred to as longer and shorter graphite pieces, may each be constructed of laminated resin-impregnated graphite sheet material such as that described above under the heading "Preparation of Laminated Graphite Materials". In constructing the heat sink apparatus 10 through the use of such resin-impregnated laminated graphite materials, the apparatus 10 may be constructed by first forming a plurality of the longer and shorter sheets 14 and 16, then assembling longer and shorter pieces 14 and 16 together in a manner like that shown in FIGS. 1 and 2, then applying pressure to the assembled pieces in a direction 38 as indicated in FIG. 1 to bond the pieces 14 and 16 together.

Preferably, when the pieces 14 and 16 are each themselves constructed from laminated resin-impregnated flexible graphite sheet material, the resin already present in the laminated resin-impregnated material provides sufficient adhesive to bond the sheets together, when the same are held together under sufficient pressure, and at sufficient temperature, for appropriate times.

Alternatively, the longer and shorter sheets 14 and 16 may be made of different materials. For example, the longer sheets may be made of pre-cured resin-impregnated graphite material and the shorter sheets may be made from uncured resin-impregnated graphite material. Once the longer and shorter sheets are assembled, they may then be placed in a fixture which applies pressure in the direction of arrows 38, and then the whole assembly is cured under pressure in the fixture in an oven to bond the spacers or shorter pieces 16 to the fins or longer pieces 14.

The sheets or pieces 14 and 16 are constructed from the laminated sheets of flexible graphite material which are oriented such that the directions of relatively high thermal conductivity of each piece are in the plane of the sheet as defined by its height 22 and the base length 30, and so that the axis of relatively low thermal conductivity is oriented through the thickness 32 of the sheet perpendicular to the plane of the sheet.

Thus, when the heat source which is the electrical device 12 is operatively attached to the heat sink apparatus 10, the fins defined by the longer sheets 14A–H conduct the heat generally perpendicularly away from the base surface 20 in a very efficient manner.

The embodiment of FIGS. 1 and 2 just described is best adapted to use with a heat source 12 having a heat transfer area of approximately the same size as the planar base surface 20 of heat sink apparatus 10. Alternatively, if the heat sink apparatus 10 is to have a base surface 20 substantially larger than the heat transfer surface of the electronic device 12, then the alternative embodiment of FIGS. 3 and 4 is preferred.

The following example of the manufacture of heat sink 10 is presented to further illustrate and explain the construction of the heat sink and is not intended to be limiting in any regard.

EXAMPLE 2

The fins 14 are manufactured from a laminated cured resin-impregnated graphite material, prepared as described above. The finished fins 14 have a thickness of 0.025 inches. The spacers 16 are manufactured from a single layer of uncured 38 wt. % 4D epoxy, 78 mg/cm$^2$ TG-440 sheet. The individual sheet is calendered to a thickness of approximately 0.032", corresponding to a density of approximately 1.45 g/cc. The sheets are cut into strips 16 having a height 24 of 10 mm, corresponding to the thickness of the base of the heat sink. After manufacture of the fins 14 and spacers 16, the stack is assembled. The stack is assembled into a steel mold and then compressed to the required length by torquing on the bolts. Steel spacers are used to position the graphite fins and spacers. The steel spacers have holes to accept the bolts that run through the mold. The bolts are torqued to compress the spacer material from its starting thickness of 0.032" to 0.028". The bottoms of the fins 14 are dipped in a liquid toughened epoxy adhesive prior to assembly to enhance bonding with the spacers. After assembling and compressing the mold, a layer of 12 wt % epoxy/graphite uncured powder of mesh size –50 mesh, calendered to approximately 1.63 g/cc (sufficient to produce a molded powder layer of approximately 4 mm) is poured into the mold. Steel platens are then placed on top of the powder and the mold placed in a TMP press. A pressure of approximately 1000 psi is applied to the steel platens and the part cured at a temperature of 310° F. for 1 hour (with 1 hour ramp time and 45 minute active cool cycle). The mold is then disassembled to produce a freestanding molded heat sink which may then be machined as desired to provide attachment structures and/or mechanical reinforcement.

The Embodiment of FIGS. 3 and 4

In FIGS. 3 and 4, a modified heat sink apparatus is shown and generally designated by the numeral 110. The heat sink apparatus 110 includes a plurality of longer pieces 114A–114I and a plurality of shorter pieces 116A–116H.

In this embodiment, a heat source 112, the plan profile of which is shown in dashed lines in FIG. 3, has an area substantially less than the base surface 120 of the heat sink apparatus 110, which base surface 120 is defined by base length 128 and base width 130.

In this embodiment, it is necessary to provide a means for transferring heat from the heat source 112 to those longer fins 114 which are not located directly above and in operative engagement with the heat source 112 itself. This is accomplished by using a heat spreader bar 150. As best seen in the cross-sectional view of FIG. 4, the base ends of the longer and shorter pieces 114 and 116 have an elongated cavity 152 defined therein which extends transversely or perpendicularly to the plane of the sheets of material. The extent of the cavity 152 is shown in dashed lines in FIG. 3.

The heat spreader bar 150, which is preferably constructed of copper, is closely received within the elongated cavity 152 as seen in FIG. 4. The heat spreader bar 150 may be held within cavity 152 by adhesive or by a heat shrink fit.

Thus heat from the heat source 112 is carried by the heat spreader bar 150 along the base length 128 to each of the longer sheets 114 which comprise the fins of the heat sink apparatus 110.

The electronic device 112 may be described as being in heat transfer engagement with the spreader bar 150, and by means of the spreader bar 150 the electronic device 112 is in heat transfer relationship with the base ends of the longer and shorter pieces 114 and 116. Preferably an interface layer 136 is provided between the electronic device 112 and the heat spreader bar 150, which interface layer 136 may be an adhesive, a thermal grease, or a solid thermal interface which may include a thin sheet of flexible graphite material.

As best seen in FIG. 3, the heat spreader bar has a bar width 154 parallel to the planes of the sheets 114 and 116, and a bar length coincident with sheet base length 128. An uppermost heat transfer surface 158 of the heat source 112 which is seen in plan view in dashed lines in FIG. 3 may be described as having a source width 160 no greater than the bar width 154, and having a source length 162 less than the bar length 128.

Thus it is seen that the apparatus of the present invention readily achieves the ends and advantages mentioned as well as those inherent therein. While certain preferred embodiments of the invention have been illustrated and described for purposes of the present disclosure, numerous changes in the arrangement and construction may be made by those skilled in the art, which changes are encompassed within the scope and spirit of the present invention as defined by the appended claims.

What is claimed is:

1. A heat sink apparatus, comprising:

alternating longer and shorter sheets of graphite material having base ends, the sheets sandwiched together such that the longer sheets extend beyond the shorter sheets to define fins, and the base ends of the longer and shorter sheets are aligned together to define a general planar base surface for engaging an electronic device to be cooled by the heat sink apparatus, wherein the graphite material comprises a resin-impregnated sheet of compressed particles of exfoliated graphite.

2. The apparatus of claim 1, wherein the graphite material has one of its axes of relatively high thermal conductivity oriented perpendicular to the planar base surface so that the fins conduct heat away from the planar base surface.

3. The apparatus of claim 1, wherein:

the alternating longer and shorter sheets are each constructed of laminated resin-impregnated flexible graphite sheet material.

4. The apparatus of claim 3, wherein:

the alternating longer and shorter sheets are adhered together by the resin of the resin-impregnated graphite sheet material without any additional adhesive.

5. The apparatus of claim 1, wherein each of the sheets of graphite material has its axes greatest thermal conductivity oriented in the plane of the sheet and its axis of lowest thermal conductivity oriented across a thickness of the sheet.

6. The apparatus of claim 1, further comprising:

an electronic heat source having a heat transfer surface defined thereon; and wherein the longer and shorter sheets have base ends defining a base surface in operative heat transfer engagement with the heat transfer surface of the electronic heat source.

7. The apparatus of claim 1, further comprising:

and a heat spreader bar operatively engaged with the base ends and extending transversely to the sheets, so that heat from a heat source may be spread to each of the longer sheets engaged by the heat spreader bar.

8. The apparatus of claim 7, wherein the heat spreader bar is constructed of copper.

9. The apparatus of claim 7, wherein:

the base ends of the longer and shorter sheets having an elongated cavity defined therein transverse to the planes of the sheets; and the heat spreader bar is closely received in the cavity.

10. The apparatus of claim 1 wherein the sheets of compressed particles of exfoliated graphite sheet which comprise the longer sheets of graphite material are oriented such that the in-plane thermal conductivity of the longer sheets extends in a direction perpendicular to the planar base surface of the heat sink.

11. The apparatus of claim 10 wherein the in-plane thermal conductivity of the longer sheets further extends in a direction parallel to the planar base surface of the heat sink.

12. The apparatus of claim 1 wherein the in-plane thermal conductivity of the longer sheets is oriented the same as the in-plane thermal conductivity of the shorter sheets.

13. A thermal management apparatus, comprising:

an electronic heat source having a heat transfer surface defined thereon; and a heat sink mounted on the heat transfer surface and including a plurality of alternating longer and shorter sheets of graphite material having base ends, the sheets extending away from the heat transfer surface, the longer sheets extending beyond the adjacent shorter sheets and defining cooling fins, and the base ends of the longer and shorter sheets are aligned together to define a general planar base surface for engaging an electronic device to be cooled by the heat sink apparatus, wherein the graphite material comprises a resin-impregnated sheet of compressed particles of exfoliated graphite.

14. The apparatus of claim 11, wherein the graphite material has one of its axes of relatively high thermal conductivity oriented perpendicular to the planar base surface so that the fins conduct heat away from the planar base surface.

15. The apparatus of claim 13, wherein:

the alternating longer and shorter sheets are each constructed of laminated resin-impregnated graphite sheet material.

16. The apparatus of claim 15, wherein:

the alternating longer and shorter sheets are adhered together by the resin of the resin-impregnated graphite sheet material without any additional adhesive.

17. The apparatus of claim 13, wherein each of the sheets of graphite material has its axes of greatest thermal conductivity oriented in the plane of the sheet and its axis of lowest thermal conductivity oriented across a thickness of the sheet.

18. The apparatus of claim 13, further comprising:

a heat spreader bar operatively engaged with the longer sheets, so that heat from a heat source may be spread to each of the longer sheets engaged by the heat spreader bar.

19. The apparatus of claim 18, wherein the heat spreader bar is constructed of copper.

20. The apparatus of claim 18, wherein the longer and shorter sheets have an elongated cavity defined therein transverse to the planes of the sheets; and the heat spreader bar is closely received in the cavity.

21. The apparatus of claim 20, further comprising:

the heat spreader bar having a bar width parallel to the planes of the sheets, and a bar length transverse to the planes of the sheets; and the heat transfer surface of the electronic heat source having a source width no greater than the bar width, and having a source length ices than the bar length.

* * * * *